(12) United States Patent
Knoll et al.

(10) Patent No.: US 11,903,154 B2
(45) Date of Patent: Feb. 13, 2024

(54) APPARATUS AND METHOD FOR MODULE RETENTION IN A MOTOR CONTROL CENTER

(71) Applicant: Rockwell Automation Technologies, Inc., Mayfield Heights, OH (US)

(72) Inventors: Karol Knoll, Myslowice (PL); Damian Najdek, Gliwice (PL)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 615 days.

(21) Appl. No.: 17/147,926

(22) Filed: Jan. 13, 2021

(65) Prior Publication Data

US 2022/0225518 A1    Jul. 14, 2022

(51) Int. Cl.
*H05K 5/02*   (2006.01)
*H02B 1/36*   (2006.01)
*H05K 7/14*   (2006.01)
*G06F 1/18*   (2006.01)

(52) U.S. Cl.
CPC ........... *H05K 5/0221* (2013.01); *G06F 1/188* (2013.01); *H02B 1/36* (2013.01); *H05K 5/0217* (2013.01); *H05K 7/1489* (2013.01); *H05K 7/1457* (2013.01)

(58) Field of Classification Search
CPC ...... H02B 1/36; H05K 7/1489; H05K 7/1457; H05K 7/1411; H05K 7/1412; H05K 7/1421; H05K 5/0221; H05K 5/023; H05K 5/0217; G06F 1/188; G06F 1/181; G06F 1/182
See application file for complete search history.

(56) References Cited

U.S. PATENT DOCUMENTS

| | | | |
|---|---|---|---|
| 2,762,879 A | 9/1956 | Wills | |
| 6,398,041 B1 * | 6/2002 | Abbott | H05K 7/1489 361/829 |
| 8,083,197 B2 * | 12/2011 | Zhang | G11B 33/124 248/27.3 |
| 9,681,574 B1 * | 6/2017 | Chen | H05K 7/1489 |

(Continued)

FOREIGN PATENT DOCUMENTS

KR    101387368 B1    4/2014

OTHER PUBLICATIONS

European Search Report dated Oct. 10, 2022; Application No./Patent No. 22151135.5-1201—(29) pages.

*Primary Examiner* — Andrew M Roersma
(74) *Attorney, Agent, or Firm* — Boyle Fredrickson, S.C.

(57) ABSTRACT

An apparatus to retain modules within a Motor Control Center (MCC) includes a plate mounted to each side of the module housing and at least one spring mounted to each plate within the module housing. The plate includes a hook at one end which connects to and pivots about an opening in the module while retaining the plate to the module. The plate also includes a retaining member extending through an opening in the module housing and configured to receive one end of the spring. The spring is under tension when connected between the retaining member of the plate and the module housing, pulling the retaining member toward the module housing. A biasing member which engages the housing of the MCC as the module is inserted is compressed toward the module during insertion. The spring pushes the biasing member outward after insertion, positively retaining the module to the MCC.

20 Claims, 7 Drawing Sheets

(56) References Cited

U.S. PATENT DOCUMENTS

| | | | | |
|---|---|---|---|---|
| 10,383,248 B1* | 8/2019 | Chen | .................. | H05K 7/18 |
| 2013/0094156 A1* | 4/2013 | Wang | .................. | G06F 1/188 |
| | | | | 361/747 |
| 2013/0255987 A1* | 10/2013 | Hu | .................. | H05K 7/20172 |
| | | | | 248/674 |
| 2013/0279123 A1* | 10/2013 | Lin | .................. | H05K 7/1487 |
| | | | | 361/747 |
| 2019/0132967 A1* | 5/2019 | Lu | .................. | H05K 5/0204 |

* cited by examiner

APPARATUS AND METHOD FOR MODULE RETENTION IN A MOTOR CONTROL CENTER

BACKGROUND INFORMATION

The subject matter disclosed herein relates to a Motor Control Center (MCC). More specifically, a hook plate is mounted to modules inserted into the MCC to prevent inadvertent ejection of the module from the MCC.

As is known to those skilled in the art, a Motor Control Center (MCC) is a power distribution center to control multiple motors from a central location. The MCC includes a power infeed configured to receive the power which is, in turn, distributed to each of the motors controlled by the MCC. The power may be a multi-phase alternating current (AC) power supply such as a 230 VAC or a 460 VAC three-phase utility supply. A primary breaker is sized according to the combined current ratings of each module to be included within the MCC and allows for a central disconnect of the MCC from the utility supply. Within the MCC a series of voltage busses extend horizontally and/or vertically to distribute the utility voltage to each module within the MCC. The MCC may include a single vertical unit, configured to receive multiple modules or multiple vertical units stacked adjacent to each other, where each vertical unit is configured to receive one or more modules.

The vertical unit includes slots configured to receive modules which are, in turn, configured to control operation of a motor. Each module may include, for example, a contactor configured to enable or disable a motor, a reversing contactor configured to additionally control direction of rotation of the motor, a starter configured to accelerate and/or decelerate a motor according to a preset ramp or acceleration profile, or a motor drive configured to control operation of the motor according to a position, velocity, or torque command. Additional modules may be provided, for example, that measure voltage and/or current being conducted along a bus within the MCC and that display the information to a technician. Each module is inserted into one of the slots on the MCC. Empty slots may receive a cover plate to prevent access internal to the MCC during operation.

Modules are configured to be inserted into and removed from the MCC with the module in an off condition. It is contemplated that an individual slot may be accessed with power supplied to the MCC, allowing "hot-swaps" of a module that has failed or insertion of a new module without requiring all motors controlled by the MCC to be shut down. A cover plate is removed, or an old module removed, and a new module is inserted into one of the slots. After insertion into the slot, a handle, also referred to herein as a connection handle, is used to fully engage the module within the MCC. During insertion, the connection handle is initially in an off position. The module is inserted a first distance into the MCC by manual insertion. The connection handle may then be moved between an off position and a test position. In the test position, the module is drawn further into the MCC, establishing connections with control power and network communications. The connection handle may be moved still further to an on position, where moving the handle to the on position mechanically draws the module still further into the MCC, during which contacts on the module engage the bus bars within the MCC and connect the module to the power distributed within the MCC. The physical transition of the connection handle to the on position may also cause a mechanical interlock to engage between the module and housing of the MCC to positively retain the module within the housing, preventing removal while the module is in the on position.

However, the MCC may operate with some modules in the on position and some modules in the off or test positions, according to the application requirements. In the off or test positions, the mechanical interlock which engages the housing of the MCC in the on position is not set. Still other modules may not include the mechanical interlock. One hazard associated with a MCC is an arc-flash hazard. An arc-flash may occur when a fault condition causes one phase of the voltage to momentarily connect to ground. Because the MCC is configured to distribute a large amount of current to multiple motors, a temporary ground fault condition can cause a substantial arc-flash, which is a sudden discharge of electrical energy and which may include substantial light, heat, and a concussive force sometimes equated to an electrical explosion. The force generated by an arc-flash condition may be sufficient to eject a module from the MCC without the mechanical interlock being engaged, creating a hazard to personnel and/or other equipment located in the control room.

Thus, it would be desirable to provide an apparatus to retain modules within an MCC and to prevent inadvertent ejection of the module from the MCC.

BRIEF DESCRIPTION

According to one embodiment of the invention, an apparatus for retaining a module in a motor control center includes a plate and a spring. The plate is configured to be mounted on an outer surface of a housing for the module. The plate includes a first end, a second end opposite the first end, and a retaining member configured to extend into the housing for the module. The spring includes a first end and a second end. The first end of the spring is configured to mount to the retaining member within the housing for the module, and the second end of the spring is configured to mount within the housing for the module. The spring is configured to apply a force to the plate in a direction away from the outer surface of the housing for the module when mounted between the retaining member and the housing for the module, and the second end of the plate is configured to resist removal of the module from the motor control center.

According to another embodiment of the invention, a method for retaining a module in a motor control center includes inserting the module a first distance into the motor control center, where the first distance is less than full insertion into the motor control center. Inserting the module the first distance into the motor control center includes deflecting a biasing member of an apparatus mounted on an outer surface of a housing for the module from a first position toward the outer surface of the housing to a second position, and expanding a spring mounted between a retaining member of the apparatus and an inner surface of the housing. The method further includes the step of inserting the module a second distance into the motor control center, where the second distance is a difference between full insertion and the first distance into the motor control center. Inserting the module the second distance into the motor control center includes moving the biasing member of the apparatus away from the outer surface of the housing with a force generated by the spring when the module is fully inserted into the motor control center, and engaging the motor control center with the biasing member when the module is fully inserted into the motor control center to resist removal of the module from the motor control center.

According to still another embodiment of the invention, an apparatus for retaining a module in a motor control center includes a plate and a spring. The plate is compressibly mounted on an outer surface of a housing for the module. The plate includes a first retaining member configured to extend into the housing for the module and a second retaining member configured to engage the motor control center. The spring is mounted between the first retaining member and an inner surface of the housing for the module. The spring is extended by compressing the plate against the outer surface of the housing during insertion of the module into the motor control center, and the spring applies a force to the plate away from the outer surface of the housing when the spring is extended. The second retaining member is configured to engage the motor control center when the module is fully inserted to resist removal of the module from the motor control center.

These and other advantages and features of the invention will become apparent to those skilled in the art from the detailed description and the accompanying drawings. It should be understood, however, that the detailed description and accompanying drawings, while indicating preferred embodiments of the present invention, are given by way of illustration and not of limitation. Many changes and modifications may be made within the scope of the present invention without departing from the spirit thereof, and the invention includes all such modifications.

BRIEF DESCRIPTION OF THE DRAWINGS

Various exemplary embodiments of the subject matter disclosed herein are illustrated in the accompanying drawings in which like reference numerals represent like parts throughout, and in which.

In describing the various embodiments of the invention which are illustrated in the drawings, specific terminology will be resorted to for the sake of clarity. However, it is not intended that the invention be limited to the specific terms so selected and it is understood that each specific term includes all technical equivalents which operate in a similar manner to accomplish a similar purpose. For example, the word "connected," "attached," or terms similar thereto are often used. They are not limited to direct connection but include connection through other elements where such connection is recognized as being equivalent by those skilled in the art.

DETAILED DESCRIPTION

The various features and advantageous details of the subject matter disclosed herein are explained more fully with reference to the non-limiting embodiments described in detail in the following description.

The subject matter disclosed herein describes an apparatus to retain modules within a Motor Control Center (MCC) and to prevent inadvertent ejection of the module from the MCC. A plate is mounted to the outside of each side of the module housing. The plate includes a hook at one end which is inserted through an opening in the module housing. The hook allows the plate to pivot about the opening in the module while retaining the plate to the module. The plate also includes a retaining member extending through an opening in the module housing. The retaining member is configured to receive one end of a spring, where the opposite end of the spring is connected to an interior surface within the module housing. The spring is under tension when connected between the retaining member of the plate and the housing, such that the spring pulls the retaining member toward the module housing.

The front of the plate includes a biasing member which engages the housing of the MCC as the module is inserted into the MCC. The biasing member compresses the plate against the outer surface of the module housing, stretching the spring internal to the module housing. As the module is inserted still further into the MCC, the biasing member reaches an opening within the MCC housing. The force applied by the spring draws the retaining member toward the inner surface of the module housing and causes the biasing member to move away from the outer surface of the module housing. The biasing member fits into the opening within the MCC housing and positively retains the module within the MCC housing. In order to remove the module from the MCC housing, a technician must manually compress the plate against the outside surface of the module housing, releasing the biasing member from the MCC housing, and then pull the module from the MCC housing. Thus, the plate and spring provide an apparatus to retain modules within a Motor Control Center (MCC) and to prevent inadvertent ejection of the module from the MCC.

Figure 1:
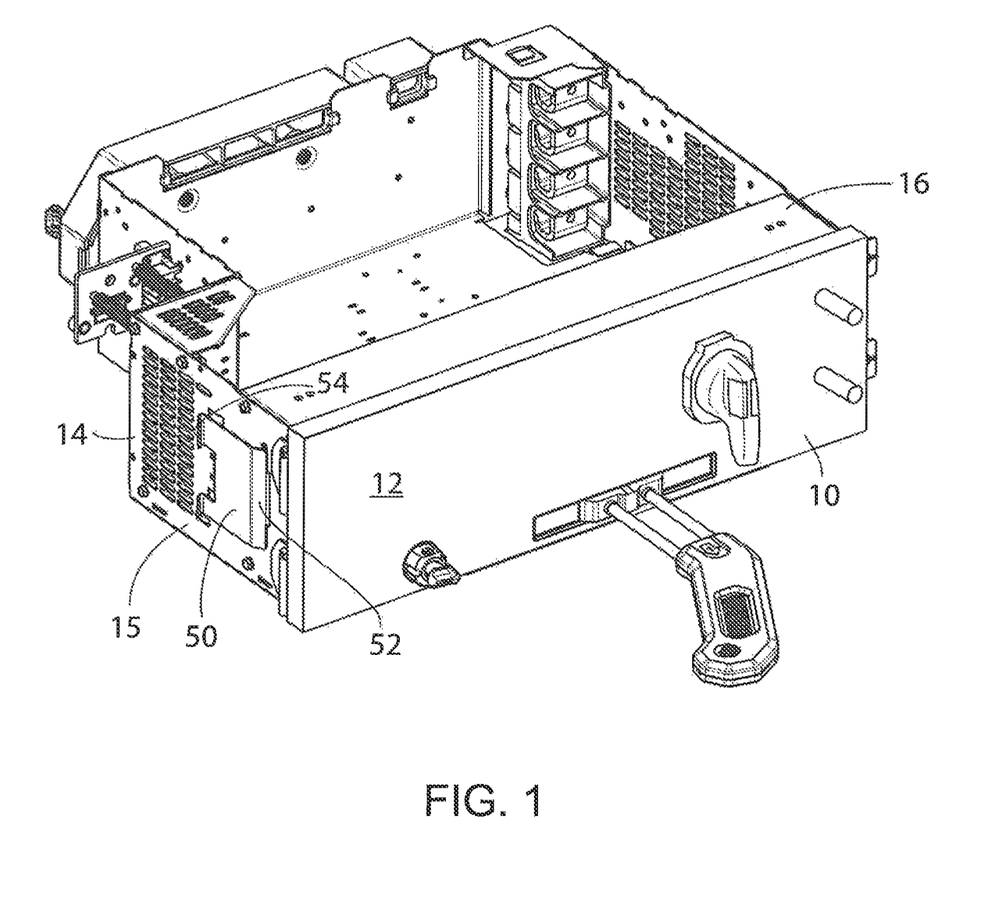
FIG. 1 is a perspective view of a module housing with one embodiment of a hook plate mounted on one side of the module.
Figure 10:
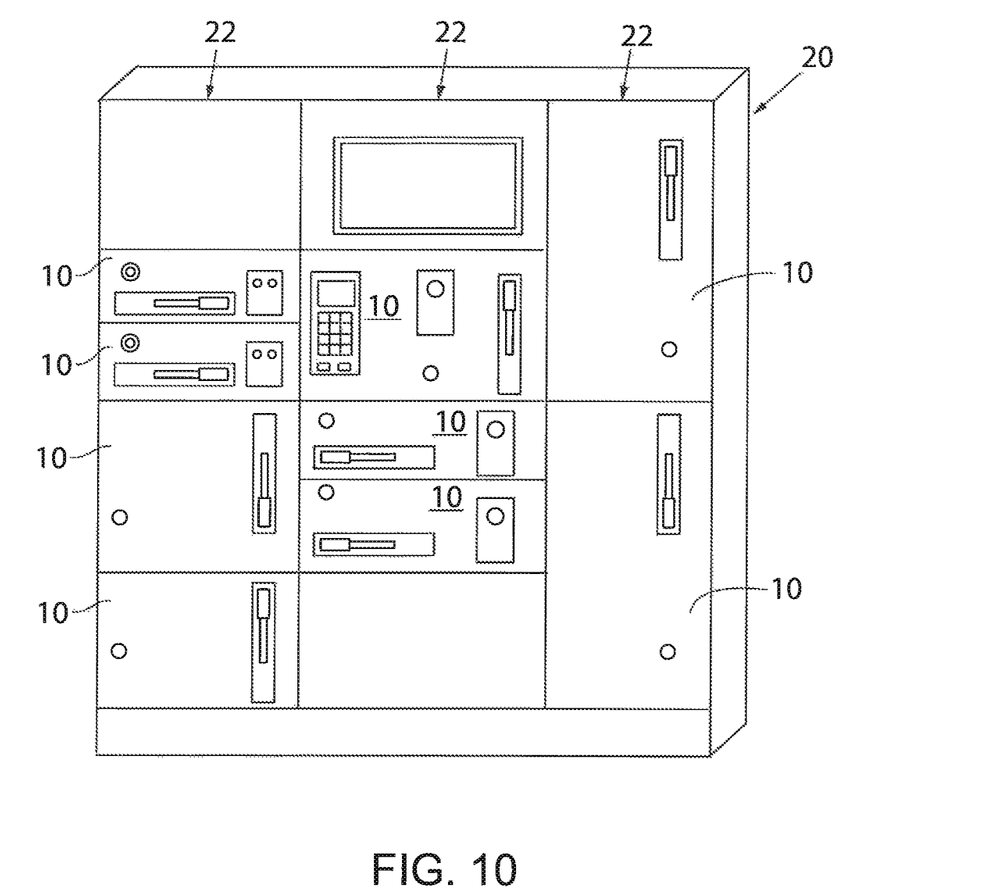
FIG. 10 is a front elevation view of an exemplary motor control center incorporating one embodiment of the present invention.

Turning initially to FIG. 1, one embodiment of a module 10 for insertion into a MCC 20 (see also FIG. 10) is illustrated. Each MCC 20 includes at least one and typically a number of vertical columns 22. Multiple modules 10 may be inserted into each column. The module 10 has a housing 15 which is generally a box-like construction, and is also referred to sometimes as drawer, for insertion into the MCC 20. The module 10 is illustrated from the front 12, side 14, and top 16. It is noted that relational terms, such as front, rear, top, bottom, upper, lower, left, right, side, and the like, are used with respect to the figures for ease of description and are not intended to be limiting. The module 10 may, for example, be inserted into a slot within the MCC 20 in a horizontal orientation or a vertical orientation by rotation of the module 10 and by which relational terms are similarly rotated.

An apparatus 50 for retaining the module 10 in the MCC 20 is shown mounted to one side 14 of the module 10. The apparatus 50 will also be referred to herein as a hook plate. A second hook plate may be mounted on the opposite side of the module 10. Turning next to FIGS. 6-9, an exemplary embodiment of the hook plate 50 is illustrated. The hook plate 50 may be made from a single piece of sheet material, such as a metal sheet, where the sheet material is formed via cutting, stamping, bending, and the like to form the illustrated hook plate. The hook plate 50 includes a first end 52 and a second end 54, opposite the first end. A first side 56 and a second side 58, opposite the first side, each extend between the first and second ends 52, 54. The hook plate 50 has a generally planar segment with an upper surface 60 and a lower surface 62.

The first end 52 of the hook plate 50 is configured to mount to the side 14 of the module 10 before insertion into the MCC 20. The first end 52 includes a first retaining member 70 configured to retain the hook plate 50 to the module 10 and allow movement of the hook plate 50 with respect to the outer surface of the module. According to the illustrated embodiment, the first retaining member 70 is an elongated hook spanning, in part, the width of the hook plate 50 and, in part, a portion of the width of the hook plate 50. The elongated hook may be formed by bending a first segment 72 of the hook plate 50 at a first angle and bending a second segment 74 of the hook plate 50 a second angle, the second angle greater than the first angle. The first segment 72 of the elongated hook 70 spans the width of the hook plate 50 and may be bent downwards, for example, about thirty degrees from the generally planar surface of the hook plate 50. The angle may vary and may be up to forty-five degrees. The second segment 74 of the elongated hook 70 spans about one-half the width of the hook plate 50 and is centrally positioned between the first side 56 and the second side 58 of the hook plate 50. The second segment 74 may be bent at an angle of approximately ninety degrees with respect to the first segment 72 such that it is angled back toward the second end 54 of the hook plate 50. The combination of the first segment 72 and second segment 74 define a hook configured to extend through an opening 17 (see FIG. 3) in the side 14 of the housing 15 for the module 10. The illustrated retaining member 70 is not intended to be limiting but provides one embodiment. It is contemplated that the first retaining member 70 may take other shapes, such as the first segment 72 and the second segment 74 having the same width, the second segment 74 having multiple portions or both the first and second segments having multiple portions defining multiple hooks to engage the housing 15 of the module. Optionally, the first retaining member 70 may be configured with a continuously curving surface rather than a first and second stamped segment 72, 74.

The second end 54 of the hook plate 50 is configured to engage the housing 25 of the MCC 20. The second end 54 includes at least one biasing member 80 configured to engage the housing 25 of the MCC 20 during insertion and to retain the hook plate 50 within the MCC 20 when the module 10 is fully inserted into the MCC. According to the illustrated embodiment, the at least one biasing member 80 includes a first hook portion 82 and a second hook portion 84. Each hook portion 82, 84 extends from the second end 54 of the hook plate 50 and curls up and back toward the hook plate 50. An upper surface 83 of the first hook portion 82 and an upper surface 85 of the second hook portion 84 are sloped upward from the second end 54 toward the center of the hook plate 50, and the portion of each hook portion 82, 84 facing the center of the hook plate 50 is open. Each hook portion 82, 84 is positioned toward one side 56, 58 of the hook plate 50. Optionally, a single hook portion may be included in a central region of the hook plate or still other numbers of hook portions may be formed from the sheet material from which the hook plate 50 is made. Each hook portion may be formed by first cutting or stamping a tab in the second end 54 of the hook plate and curling the end back. It is contemplated that the biasing member 80 may include alternate constructions. According to one aspect of the invention, the second end 54 of the hook plate 50 may include one or more tabs integrally formed on the plate. Each tab may include a tapered surface with a narrow end of the tapered surface proximate to the second end 54 of the hook plate and a wider end of the tapered surface positioned inward toward the center of the hook plate 50. A flat surface may extend downward at the widest end of the tab to the upper surface 60 of the hook plate 50. Still other suitable arrangements of biasing members may be included without deviating from the scope of the invention.

A second retaining member 90 may be positioned in a middle region of the hook plate 50. According to the illustrated embodiment, the second retaining member 90 may be formed between the first hook portion 82 and the second hook portion 84. The hook plate 50 is cut for a distance from the second end 54 of the hook plate toward the center portion of the hook plate along each side of the first and second hook portions 82, 84. The second retaining member 90 is formed from the sheet material remaining between each cut. The sheet material is first bent downward defining a first segment 92 of the second retaining member 90. The sheet material is then bent such that a second segment 94 is generally orthogonal to the first segment 92 of the second retaining member 90. At least one opening 96 is formed in the second segment 94, where each opening 96 is configured to receive one end of a spring 100. A first end 102 of the spring is connected to the second retaining member 90, and a second end 104 of the spring is connected to an inner surface of the housing 15.

In operation, the hook plate 50 is configured to positively retain the module 10 within the MCC 20 once the module 10 has been fully inserted. With reference to FIG. 1, a hook plate 50 is mounted to the side of the housing 15 for each module 10. Although only one side of the housing 15 is visible, it is contemplated that a first hook plate 50 is mounted on a first side of the module 10, and a second hook plate 50 is mounted on a second side of the module 10. The first retaining member 70 on the first end 52 of the hook plate 50 is inserted through a first opening 17 in the housing 15 of the module 10 (see also FIG. 3). The hook shape of the first retaining member 70 allows the hook plate 50 to pivot about the edge of the housing 15. The second retaining member 90 is inserted through a second opening 19 in the housing 15. At least one spring 100 is mounted between the second segment 94 of the second retaining member and an inner surface of the housing 15. According to the illustrated embodiment, the hook plate 50 includes two openings 96 in the second segment 94. A first spring 100 is mounted to one of the openings 96, and a second spring is mounted to the second opening 96. The springs 100 draw the second segment 94 of the second retaining member 90 toward the housing 15 of the module. The second retaining member 90, in turn, pushes the hook plate 50 away from the outer surface of the module 10 as it is drawn toward the housing 15.

Figure 2:
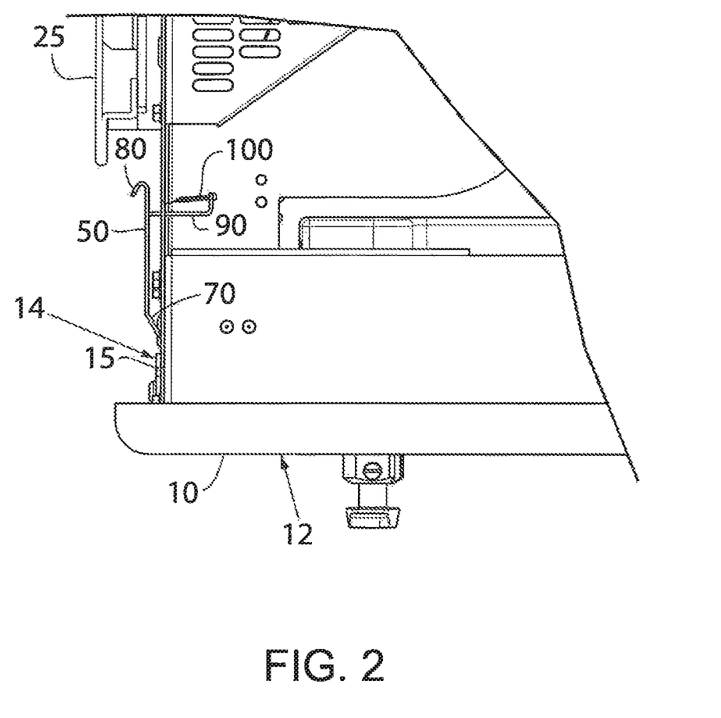
FIG. 2 is a partial top plan view of a first side of the module housing of FIG. 1 being aligned for insertion into a motor control center.
Figure 3:
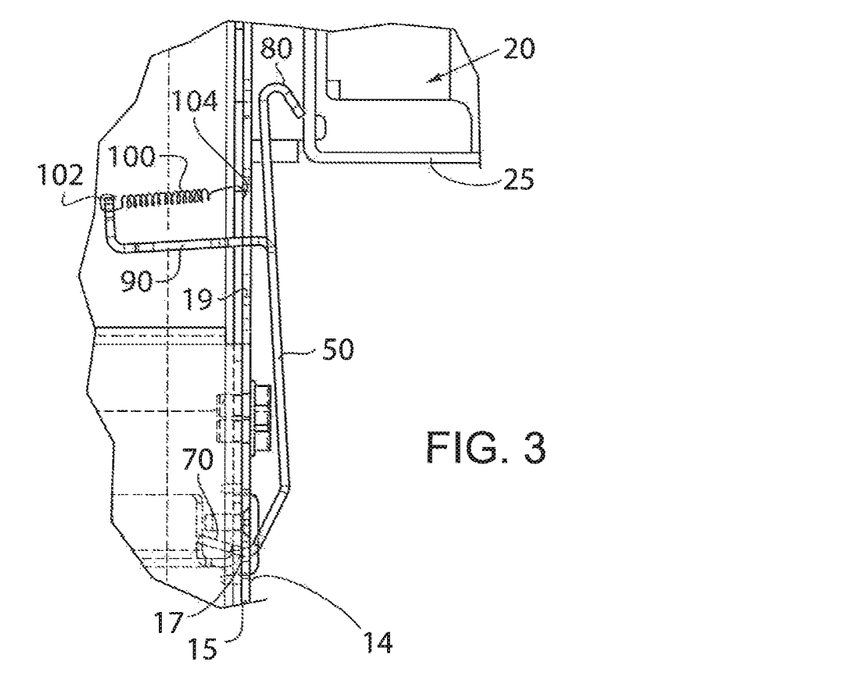
FIG. 3 is a partial top plan view of a second side of the module housing of FIG. 1 beginning insertion into the motor control center.

With reference to FIGS. 2-5, the steps for inserting the module 10 into the MCC 20 are illustrated. In FIG. 2, the module 10 is positioned into a slot for the MCC 20. The module 10 is inserted for a first distance before the hook plate 50 begins to engage the housing 25 of the MCC 20. As illustrated in FIG. 2, the module 10 has not yet been inserted a sufficient distance for the hook plate 50 to begin engaging the housing 25 of the MCC. As illustrated in FIG. 3, the module 10 has been inserted beyond the first distance and the hook plate 50 is already engaging the housing 25 of the MCC. As the hook plate 50 begins to engage the housing 25 of the MCC, the upper surface 83, 85 of each hook portion 82, 84 meets the edge of the housing 25 for the MCC 20. The tapered upper surface 83, 85 slides along the edge of the housing 25, compressing the hook plate 50 inward toward the outer surface of the housing 15 of the module 10. As the hook plate 50 is compressed inwards, the second retaining member 90 is pushed further into the housing 15 and stretches the spring, or springs, 100 within the module 10. Stretching the springs 100 creates a force applied to the second retaining member 90 in a direction toward the inner surface of the housing 15.

Figure 4:
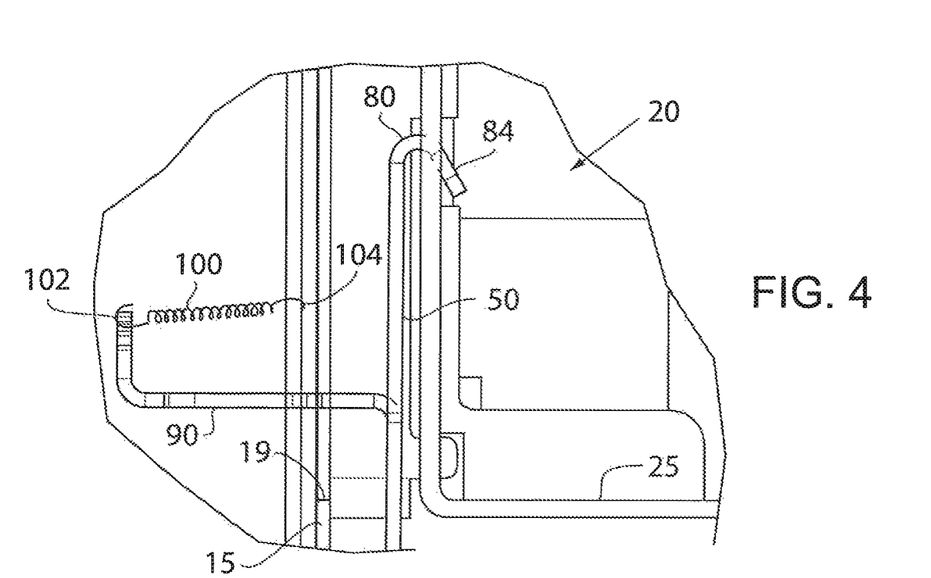
FIG. 4 is a partial top plan view of the second side of the module housing inserted into the motor control center.
Figure 5:
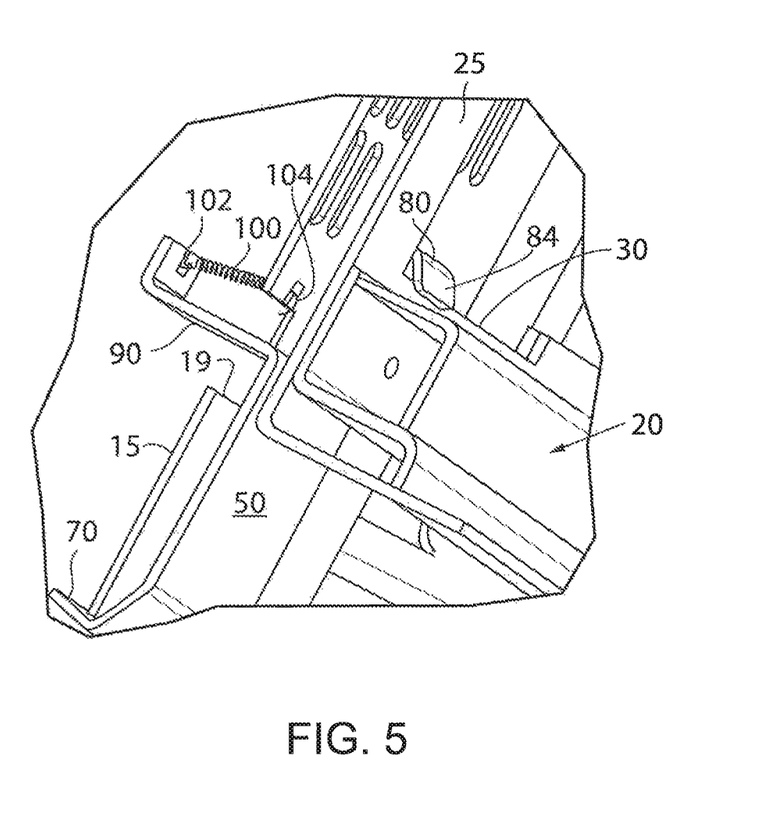
FIG. 5 is a partial perspective view of a section of the second side of the module housing inserted into the motor control center.
Figure 6:
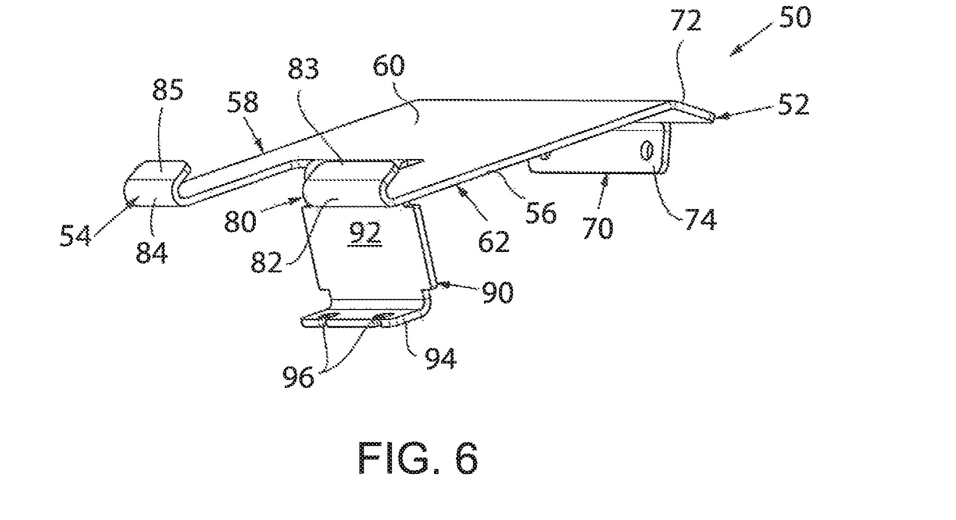
FIG. 6 is a perspective view of the hook plate of FIG. 1.
Figure 7:
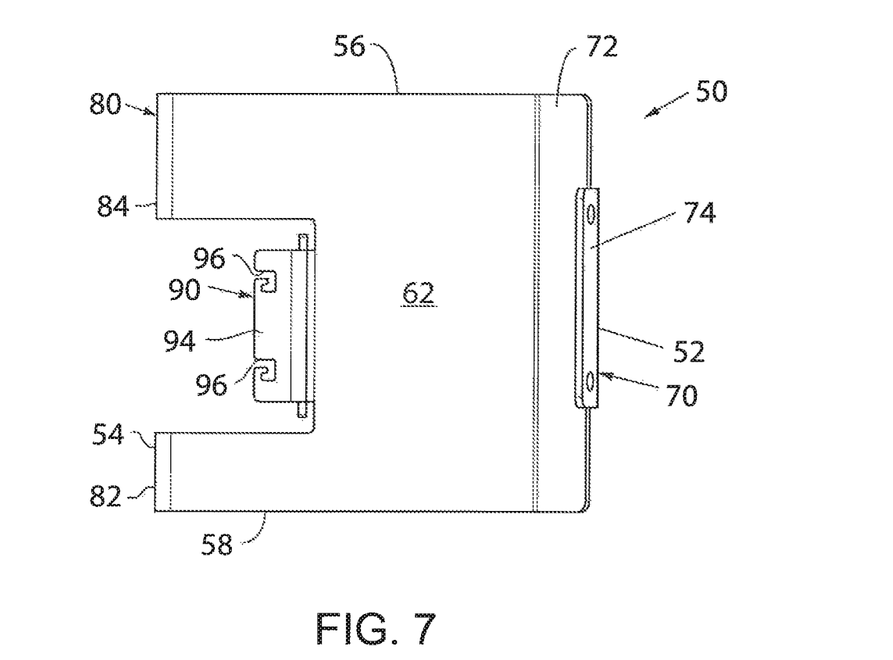
FIG. 7 is a lower plan view of the hook plate of FIG. 6.
Figure 8:
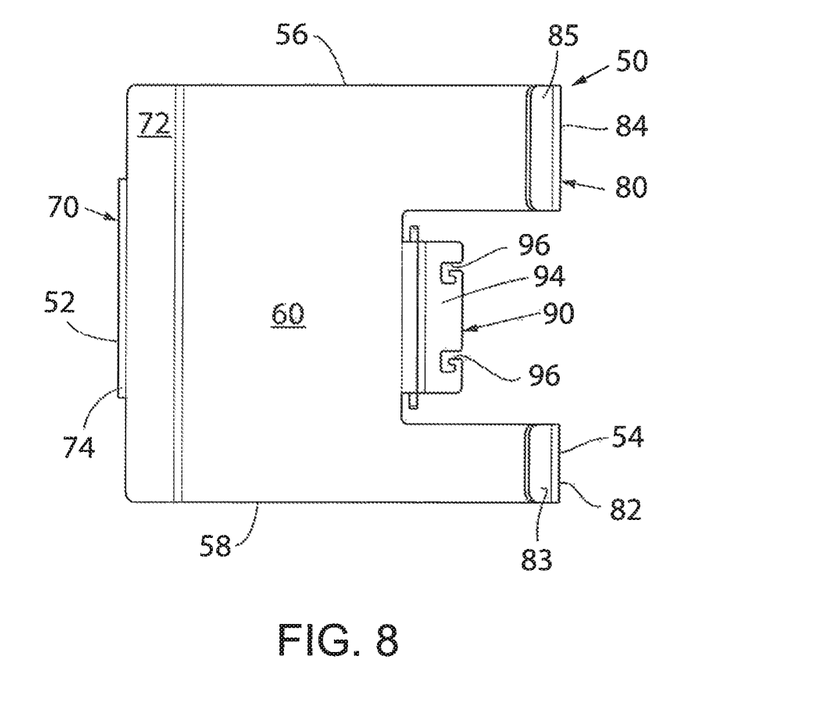
FIG. 8 is an upper plan view of the hook plate of FIG. 6.
Figure 9:
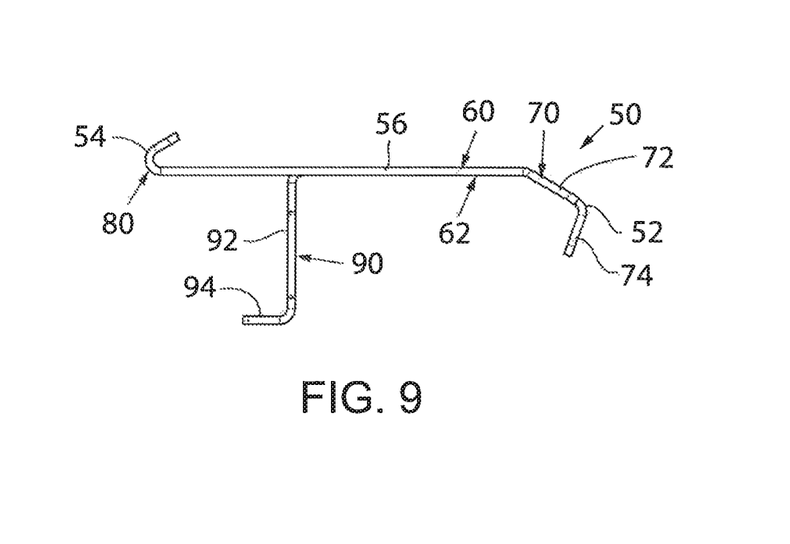
FIG. 9 is a side elevation view of the hook plate of FIG. 6.

Turning next to FIGS. 4 and 5, the module 10 is shown fully inserted into the MCC 20. When the module 10 is fully inserted into the MCC 20, the biasing member 80 is located next to an opening 30 in the housing 25 of the MCC 20. Because the biasing member 80 is no longer adjacent to the surface of the housing 25, the force of the spring, or springs, 100 applied to the second retaining member 90 draws the second retaining member 90 toward the inner surface of the module housing 15 and, in turn, moves the hook plate 50 away from the outside surface of the module housing. The biasing member 80 is, moved inward to the opening 30 within the housing of the MCC 20. As shown in FIGS. 4 and 5, the hook portions 82, 84 of the biasing member 80 extend around the surface of the housing 25 for the MCC. As a result, an attempt to remove the module 10 will cause the hook portion 82, 84 to catch on the housing 25 and prevent removal of the module 10. The hook portions 82, 84 can prevent an intentional attempt to remove the module 10 or an inadvertent attempt to eject the module.

In order to remove the module 10, the hook plate 50 must first be compressed toward the outer surface of the housing 15 for the module 10. With reference to FIG. 4 and as may be appreciated via the illustration of FIG. 2, when the module 10 is fully inserted into the MCC, the front plate 12 of the module 10 does not fully engage the housing 25 of the MCC 20. A gap exists between the housing 25 and the module through which a technician may access the hook plates 50. Manual pressure may be applied by the technician to the upper surface 60 of each hook plate 50, compressing the hook plate against the outer surface of the module 10. This compression moves the biasing member 80 out of the opening 30 in the housing 25 of the MCC 20. Because the hook portions 82, 84 no longer engage the edge of the housing 25 for the MCC 20, the module 10 may be pulled out of the MCC. Thus, the module 10 may be intentionally removed from the MCC 20 while preventing an inadvertent ejection.

It should be understood that the invention is not limited in its application to the details of construction and arrangements of the components set forth herein. The invention is capable of other embodiments and of being practiced or carried out in various ways. Variations and modifications of the foregoing are within the scope of the present invention. It also being understood that the invention disclosed and defined herein extends to all alternative combinations of two or more of the individual features mentioned or evident from the text and/or drawings. All of these different combinations constitute various alternative aspects of the present invention. The embodiments described herein explain the best modes known for practicing the invention and will enable others skilled in the art to utilize the invention.

In the preceding specification, various embodiments have been described with reference to the accompanying drawings. It will, however, be evident that various modifications and changes may be made thereto, and additional embodiments may be implemented, without departing from the broader scope of the invention as set forth in the claims that follow. The specification and drawings are accordingly to be regarded in an illustrative rather than restrictive sense.

We claim:

1. An apparatus for retaining a module in a motor control center, the apparatus comprising:
    a plate mounted to an outer surface of a housing for the module, the plate having:
        a first end,
        a second end opposite the first end, and
        a retaining member configured to extend into the housing for the module; and
    a spring having a first end and a second end, wherein:
        the first end of the spring is mounted to the retaining member within the housing for the module,
        the second end of the spring is mounted within the housing for the module,
        the spring is configured to apply a force to the plate in a direction away from the outer surface of the housing for the module when mounted between the retaining member and the housing for the module, and
        the second end of the plate is configured to resist removal of the module from the motor control center.

2. The apparatus of claim 1, wherein the first end of the plate is pivotally mounted to the outer surface of the housing.

3. The apparatus of claim 2, wherein the first end of the plate includes at least one hook configured to engage an opening extending through the housing for the module.

4. The apparatus of claim 2, wherein:
    the second end of the plate includes a biasing member,
    the biasing member is deflected toward the housing for the module as the module is inserted into the motor control center, and
    the spring applies the force to the plate when the module is fully inserted into the motor control center to engage the biasing member with an opening in a housing for the motor control center to resist removal of the module from the motor control center.

5. The apparatus of claim 4, wherein the biasing member includes at least one hook formed on the second end of the plate.

6. The apparatus of claim 4, wherein the retaining member, at least one hook on the first end of the plate, and the biasing member on the second end of the plate are made from a single piece of sheet material.

7. The apparatus of claim 1 wherein the plate is a first plate configured to be mounted on a first side of the outer surface of the housing for the module and wherein the spring is a first spring configured to mount to the first plate, the apparatus further comprising:
    a second plate mounted to a second side of the outer surface of the housing for the module, the second plate having:
        a first end,
        a second end opposite the first end, and
        a retaining member configured to extend into the housing for the module; and
    a second spring having a first end and a second end, wherein:
        the first end of the second spring is mounted to the retaining member of the second plate within the housing for the module, the second end of the second spring is mounted within the housing for the module, the second spring is configured to apply a force to the second plate in a direction away from the second side of the housing for the module when mounted between the retaining member and the housing for the module, and the second end of the second plate is configured to resist removal of the module from the motor control center.

8. A method for retaining a module in a motor control center, the method comprising the steps of:

inserting the module a first distance into the motor control center, the first distance being less than full insertion into the motor control center, wherein inserting the module the first distance into the motor control center includes:

deflecting a biasing member of an apparatus mounted to an outer surface of a housing for the module from a first position toward the outer surface of the housing to a second position, and expanding a spring mounted between a retaining member of the apparatus and an inner surface of the housing; and inserting the module a second distance into the motor control center, the second distance being a difference between full insertion and the first distance into the motor control center, wherein inserting the module the second distance into the motor control center includes:

moving the biasing member of the apparatus away from the outer surface of the housing with a force generated by the spring when the module is fully inserted into the motor control center, and engaging the motor control center with the biasing member when the module is fully inserted into the motor control center to resist removal of the module from the motor control center.

9. The method of claim 8, wherein a first end of the apparatus is pivotally mounted to the outer surface of the housing.

10. The method of claim 9, wherein:

the first end of the apparatus includes at least one hook configured to engage an opening extending through the housing for the module, and deflecting the biasing member includes pivoting the apparatus about the hook.

11. The method of claim 8, wherein the biasing member includes at least one hook formed on a second end of the apparatus.

12. The method of claim 11, wherein:

the at least one hook has a curved surface oriented toward a direction of insertion for the module;

the step of deflecting the biasing member of the apparatus includes the curved surface of the at least one hook engaging a surface of the motor control center and the curved surface sliding along the surface of the motor control center; and the step of engaging the motor control center with the biasing member includes inserting the module within the motor control center until the at least one hook reaches at least one opening in the surface of the motor control center and the at least one hook is moved into the at least one opening by the force generated by the spring and is positioned to catch on the surface of the motor control center if removal of the module is attempted.

13. The method of claim 8 wherein:

the apparatus is a first apparatus mounted on a first outer surface of the housing, the spring is a first spring mounted between the retaining member of the first apparatus and the inner surface of the housing, and the method further includes the steps of:

mounting a second apparatus on a second outer surface of the housing; and mounting a second spring between a retaining member of the second apparatus and the inner surface of the housing.

14. An apparatus for retaining a module in a motor control center, the apparatus comprising:

a plate compressibly mounted to an outer surface of a housing for the module, the plate having a first retaining member configured to extend into the housing for the module and a second retaining member configured to engage the motor control center; and a spring mounted between the first retaining member and an inner surface of the housing for the module, wherein:

the spring is extended by compressing the plate against the outer surface of the housing during insertion of the module into the motor control center, the spring applies a force to the plate away from the outer surface of the housing when the spring is extended, and the second retaining member is configured to engage the motor control center when the module is fully inserted to resist removal of the module from the motor control center.

15. The apparatus of claim 14 wherein:

the second retaining member includes a biasing member configured to engage a surface of the motor control center during insertion, engaging the surface of the motor control center with the biasing member compresses the plate against the outer surface of the housing, and when the module is fully inserted into the motor control center, the biasing member is positioned adjacent an opening in the surface of the motor control center and the force applied by the spring forces the plate away from the outer surface of the housing for the module and pushes the biasing member into the opening in the surface of the motor control center.

16. The apparatus of claim 15, wherein the plate includes a third retaining member pivotally mounted to the outer surface of the housing for the module.

17. The apparatus of claim 16, wherein the third retaining member includes at least one hook configured to engage an opening extending through the housing for the module.

18. The apparatus of claim 16, wherein the third retaining member is located at a first end of the plate and wherein the second retaining member includes at least one hook formed on a second end of the plate, the second end opposite the first end.

19. The apparatus of claim 18, wherein the first, second, and third retaining members are made from a single piece of sheet material.

20. The apparatus of claim 14 wherein the plate is a first plate compressibly mounted to a first side of the outer surface of the housing for the module and wherein the spring is a first spring mounted between the first retaining member of the first plate and the inner surface of the housing, the apparatus further comprising:

a second plate compressibly mounted to a second side of the outer surface of the housing for the module, the second plate having a first retaining member configured to extend into the housing for the module and a second retaining member configured to engage the motor control center;

a second spring mounted between the first retaining member of the second plate and an inner surface of the housing for the module, wherein:

the second spring is extended by compressing the second plate against the outer surface of the housing during insertion of the module into the motor control center, the second spring applies a force to the second plate away from the outer surface of the housing when the second spring is extended, and the second retaining member of the second plate is configured to engage the motor control center when the module is fully inserted to resist removal of the module from the motor control center.

* * * * *

UNITED STATES PATENT AND TRADEMARK OFFICE
CERTIFICATE OF CORRECTION

| | |
|---|---|
| PATENT NO. | : 11,903,154 B2 |
| APPLICATION NO. | : 17/147926 |
| DATED | : February 13, 2024 |
| INVENTOR(S) | : Karol Knoll and Damian Najdek |

It is certified that error appears in the above-identified patent and that said Letters Patent is hereby corrected as shown below:

On the Title Page

Item (72):
--Karol Knoll, Myslowice (PL)
Damian Najdek, Gliwice (PL)--

Should be:
--Karol Knoll, Myslowice (PL)
Damian Najdek, Gliwice (PL)
Daniel Jastrzebski, Mikolow (PL)--

Signed and Sealed this
Sixteenth Day of April, 2024

Katherine Kelly Vidal
*Director of the United States Patent and Trademark Office*